US008630831B2

(12) United States Patent
Bratvedt et al.

(10) Patent No.: US 8,630,831 B2
(45) Date of Patent: Jan. 14, 2014

(54) STREAMLINE FLOW SIMULATION OF A MODEL THAT PROVIDES A REPRESENTATION OF FRACTURE CORRIDORS

(75) Inventors: Frode Bratvedt, Asker (NO); Kyrre Bratvedt, Khalifa (AE); Vsevolod Laptev, Moscow (RU); Sanjoy Kumar Khataniar, Abingdon (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 237 days.

(21) Appl. No.: 12/920,914

(22) PCT Filed: Jun. 16, 2009

(86) PCT No.: PCT/US2009/047477
§ 371 (c)(1),
(2), (4) Date: Sep. 3, 2010

(87) PCT Pub. No.: WO2009/155274
PCT Pub. Date: Dec. 23, 2009

(65) Prior Publication Data
US 2011/0082676 A1    Apr. 7, 2011

Related U.S. Application Data

(60) Provisional application No. 61/132,146, filed on Jun. 16, 2008.

(51) Int. Cl.
*G06G 7/48* (2006.01)
*G06G 7/50* (2006.01)
*G06G 7/57* (2006.01)

(52) U.S. Cl.
USPC .......................................................... 703/10

(58) Field of Classification Search
None
See application file for complete search history.

(56) References Cited

U.S. PATENT DOCUMENTS

| 6,826,520 | B1 | 11/2004 | Khan et al. |
| 2003/0216898 | A1 | 11/2003 | Basquet et al. |
| 2004/0015295 | A1 | 1/2004 | Bratvedt et al. |
| 2008/0133186 | A1* | 6/2008 | Li et al. ............................ 703/2 |
| 2008/0225640 | A1 | 9/2008 | Akbar et al. |

OTHER PUBLICATIONS

Aarnes et al. "Multiscale Mixed/Mimetic Methods on Corner-Point Grids", J Computational Geosciences, vol. 12, No. 3, Jan. 30, 2008, pp. 1-35.*
Lunati et al. "Multiscale finite-volume method for compressible multiphase flow in porous media" Journal of Computational Physics, 2006, 216, pp. 616-636.*
Stenerud et al. "Adaptive Multiscale Streamline Simulation and Inversion for High-Resolution", Feb. 26, 2007, SPE 106228, 15 pages.*
Aarnes, Jorg E. et al., "Multiscale Mixed/Mimetic Methods on Corner-Point Grids," J. Computational Geosciences, Jan. 30, 2008, pp. 1-35, vol. 12, No. 3.

* cited by examiner

*Primary Examiner* — Suzanne Lo
(74) *Attorney, Agent, or Firm* — Brian Pangrle; Lam Nguyen; Rodney Warfford (57) ABSTRACT

To simulate a subterranean structure having fracture corridors, a model is used to represent the subterranean structure, where the model also provides a representation of the fracture corridors. A streamline simulation is performed using the model.

20 Claims, 5 Drawing Sheets

STREAMLINE FLOW SIMULATION OF A MODEL THAT PROVIDES A REPRESENTATION OF FRACTURE CORRIDORS

CROSS-REFERENCE TO RELATED APPLICATIONS

This claims the benefit under 35 U.S.C. §119(e) of U.S. Provisional Application Ser. No. 61/132,146, entitled "METHOD FOR MIMETIC MULTISCALE MODELING AND STREAMLINES FOR IMPROVED SIMULATION EFFICIENCY IN FRACTURED RESERVOIR MODELS," filed Jun. 16, 2008, which is hereby incorporated by reference.

BACKGROUND

To better understand the content (e.g., hydrocarbons, fresh water, etc.) of a reservoir in a subterranean formation, characterization of the reservoir can be performed using geological modeling techniques. Modern geological modeling techniques are leading the industry to routinely build relatively large and detailed three-dimensional geocellular models. These models currently may range in size from 10 to 100 million grid cells and are growing. This has resulted in a steadily increasing gap between flow simulation capability and the desire to build geologic-scale reservoir simulation models.

In addition to sheer size, strong heterogeneity in the geological models may create computational problems during flow simulation. Geological models may need to use relatively small cells that have highly contrasting reservoir properties in order to adequately capture reservoir heterogeneity. Moreover, within a geological model, there may often be a relatively small proportion of active (porous and permeable) cells that are sparsely distributed. These factors may result in relatively complex hydraulic connectivity. Traditional finite difference flow simulators are not designed to handle such geological models efficiently and often have to resort to a processing of upscaling the grid to achieve practical computational times. This upscaling process however reduces the resolution to which flow behavior can be accurately resolved thus losing the benefits of the detailed geological characterization.

Additionally, the presence of fractures in a reservoir can pose an additional challenge when modeling the reservoir. The common approach to modeling fractured reservoirs has been to idealize the fractured reservoir as a dual porous and permeable medium by interacting matrix and fracture grid cells. This concept has been extended to multiple interacting porous mediums for very complex fractured, typically carbonate, reservoirs. Typically, this is an acceptable method for reservoirs that are dominated by small scale fractures, typically much smaller that simulation grid cells. Comparatively there are typically few fracture corridors present in reservoirs and these large structures can act as flow barriers if they are cemented or as fluid highways. Fracture corridors are an extraordinary cluster of a large number of quasi-parallel fractures. They can be deterministically described with the help of reservoir characterization techniques and they present one of the major factors affecting the flow in the reservoir. Although the dimensions of fracture corridors are much larger than the dimension of a single fracture, there is still a problem with resolving fracture corridors using the standard coarse scale simulation grid: the thickness of fracture corridors is much smaller than the typical size of the cell and also the direction could be different from the grid orientation. Without proper resolution there is no confidence in obtained results.

SUMMARY

In general, to simulate a subterranean structure having fracture corridors, a model is used to represent the subterranean structure, where the model also provides a representation of the fracture corridors. A streamline simulation is performed using the model.

Other or alternative features will become apparent from the following description, from the drawings, and from the claims.

DETAILED DESCRIPTION

In the following description, numerous details are set forth to provide an understanding of some embodiments. However, it will be understood by those skilled in the art that other embodiments may be practiced without these details and that numerous variations or modifications from the described embodiments are possible.

As noted above, the presence of fractures in a subterranean structure (e.g., a fluid reservoir) can pose an additional challenge when modeling the reservoir. Fractures refer to breaks in a subterranean formation. A collection of fractures may provide paths for fluid flow or barriers for fluid flow. Such paths are referred to as fracture corridors. A carbonate reservoir tends to have naturally formed fractures. To improve recovery of fluids from fractured reservoirs, an operator has to have a thorough understanding of the depletion and displacement properties of the fractured reservoirs. Fracture corridors have to be placed in the reservoir at their exact locations and they have to be explicitly modeled in a grid structure.

Fractured reservoirs are complex geological structures in which fluids are stored in matrix blocks and flow occurs in the fractures. It is recognized that conventional simulation methods may not be able to deliver sufficient resolution of the complex flow patterns that may develop when a fractured reservoir is produced.

In general, according to some embodiments, a technique or mechanism for simulating a subterranean structure (e.g., a fluid reservoir) having fracture corridors includes creating a model providing a representation of the fracture corridors. Using such model, a streamline simulation can then be performed to characterize the subterranean structure.

A "streamline" can be thought of as a trajectory of a particle in a velocity/flux field; stated differently, a streamline refers to a path that a particle would take through a three-dimensional space (e.g., reservoir) for a pressure solution at a given time. The three-dimensional domain of the reservoir is decomposed into many one-dimensional streamlines, and fluid flow calculations are performed along each streamline. Performing streamline simulation refers to generating output values using a solver according to some embodiments along streamlines in the subterranean structure. A further explanation regarding streamline simulation is provided in U.S. Patent Publication No. 2004/0015295, by Kyrre Bratvedt et al.

Figure 1:
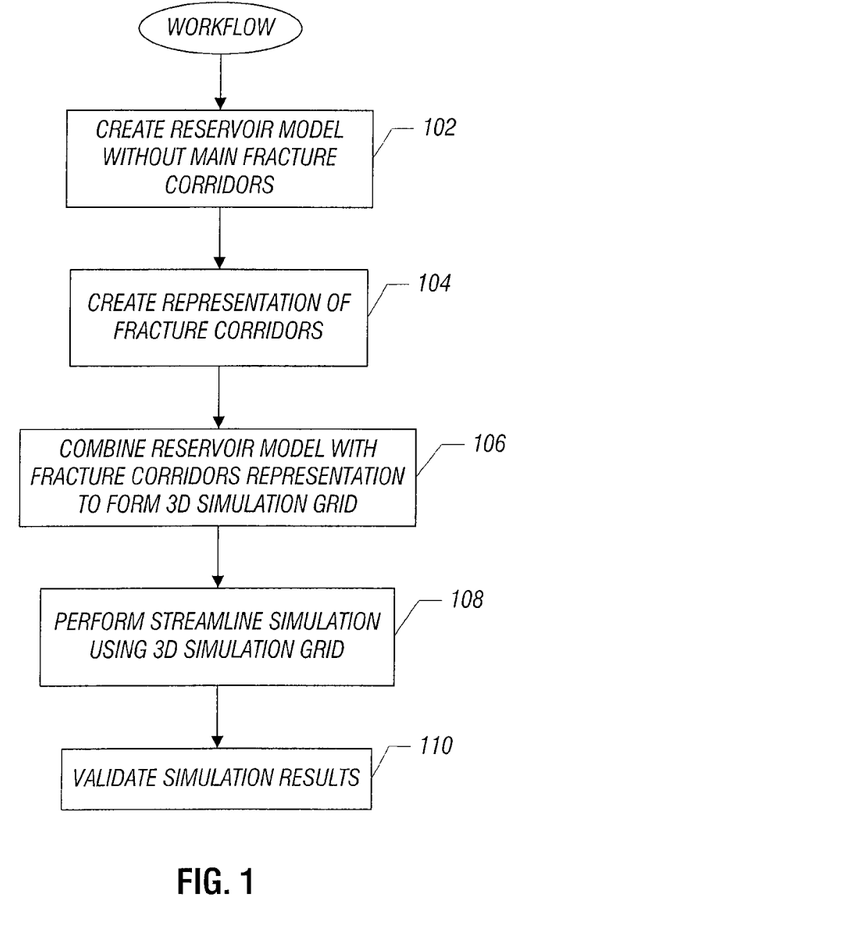
FIG. 1 is a flow diagram of a general workflow according to an embodiment.

FIG. 1 illustrates a general workflow according to an embodiment. The process of FIG. 1 can be performed by software, hardware, firmware, various logic, and so forth (or any combination thereof). Initially, a reservoir model is created (at 102) for modeling the reservoir without main fracture corridors. In some implementations, minor fractures can be represented in the reservoir model as a dual porosity model. In other implementations, minor fractures are not represented in the reservoir model. The background reservoir model not containing the fracture corridor representation can be any simulation grid represented as a collection of volume cells using any discretization method for creating finite volume cells, e.g. hexahedral, polyhedral, perpendicular-bisector (PEBI) cells, etc. Although reference is made to creating one reservoir model, it is noted that in some implementations multiple realizations of the reservoir model can be created, where different realizations of the reservoir model can be created using different techniques. Generally, the reservoir model includes a first grid that includes background geological information for the reservoir.

In addition, a representation (second grid) of fracture corridors is created (at 104). One example technique of creating the representation of fracture corridors is described in U.S. Patent Publication No. 2008/0225640, by Mahmood Akbar et al. Again, although FIG. 1 refers to creating just one representation of fracture corridors, it is noted that in a different implementation multiple representations of fracture corridors can be created.

Next, the reservoir model and representation of the fracture corridors is combined to provide an overall model (the first grid and second grid are combined to form a simulation grid). Effectively, the fracture corridors represented by the representation are superimposed onto the reservoir model. In performing the superimposition, the background (first) grid corresponding to the reservoir model is left unchanged, with additional grid nodes added that represent the fracture corridors. In some embodiments, a three-dimensional (3D) grid model is created that can be used for simulation.

Streamline simulation is then performed (at 108) using the 3D grid model. In some implementations, the simulation results can be validated (at 110) to determine the flow performance quality of the model.

In performing the streamline simulation using the 3D grid model (at 108), one of several performance enhancing techniques can be employed, including a multiscale technique, a mimetic discretization technique, or a two-point finite volume discretization technique.

Figure 2:
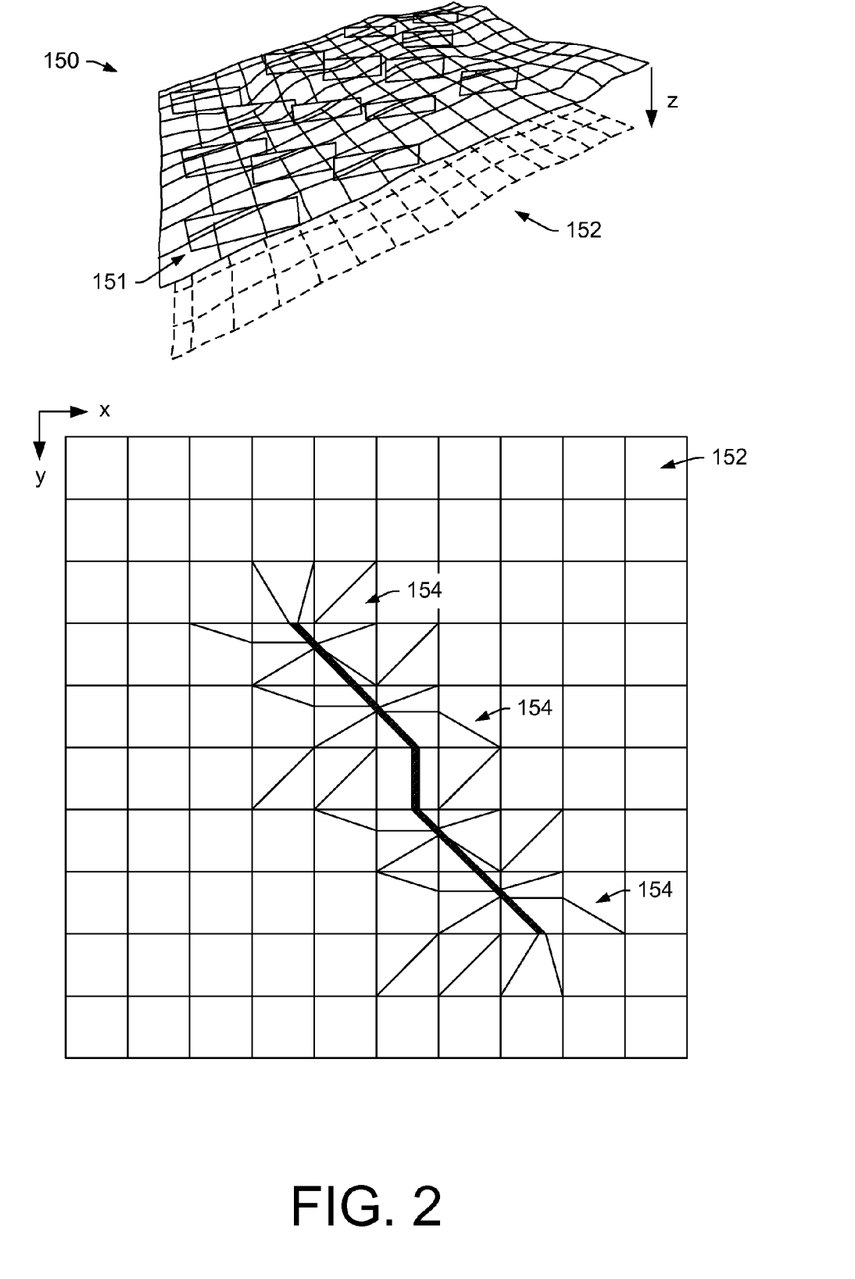
FIG. 2 illustrates a hierarchical grid structure having a coarse grid and a fine grid for representing a subterranean structure, according to an embodiment.

With the multiscale technique, a subterranean structure can be represented using a multiscale grid model having at least a coarse grid and a fine grid of finer scale than the coarse grid. Multiscale modeling of flow and transport of fluids in porous media is based on a hierarchical grid structure including a coarse grid and an underlying fine-scale grid containing reservoir heterogeneities. FIG. 2 illustrates an example of a model 150 that includes fracture objects 151 (e.g., fracture objects, fracture corridor objects, etc.) and an example of a hierarchical grid structure having a coarse grid and a fine grid. The coarse grid includes blocks 152 some of which include a connected collection of cells (represented as polygonal cells 154 produced by performing refinement) from the underlying fine grid. In the fine grid of cells 154, a fracture corridor is represented by a thick black line that is resolved by the fine grid.

To form the coarse grid, an input grid representing a subterranean structure can be partitioned, such as by using uniform partitioning in which each block of the coarse grid has an equal number of cells. Other techniques of partitioning an input grid into blocks of the coarse grid can be used in other implementations.

In the fine grid, cells are associated with various reservoir properties, such as rock and rock-fluid properties. As discussed further below, to further improve efficiency in performing flow simulation (for simulation fluid flow in porous media of a reservoir in a subterranean formation), discretization is applied to the fine grid. The discretization of the fine grid is part of a mimetic technique that approximates various functions used for solving for pressures and fluxes. Using mimetic approximation allows for provision of a computationally more accurate solver used for performing simulation of a reservoir.

The global flow problem is solved on the coarse grid using special basis functions that have sub-grid resolution. The basis functions are constructed by solving local flow problems on the fine grid and can be used to reconstruct a conservative approximation of the fine-scale fluxes and pressures. Flux refers to an amount of fluid flow per unit area per unit time.

In an alternative embodiment, a two-point finite volume discretization technique can be used. The two-point scheme is a finite volume method to discretize the pressure equation, where the pressure variables are given in the cells (let say, at the centroid of the cell) and the flux through a face between two neighboring cells is approximated using only the pressure variables corresponding to these two cells. The approximation depends on the known geometry and properties of both cells. The two-point finite volume discretization technique can be used with or without the multiscale technique.

Figure 3:
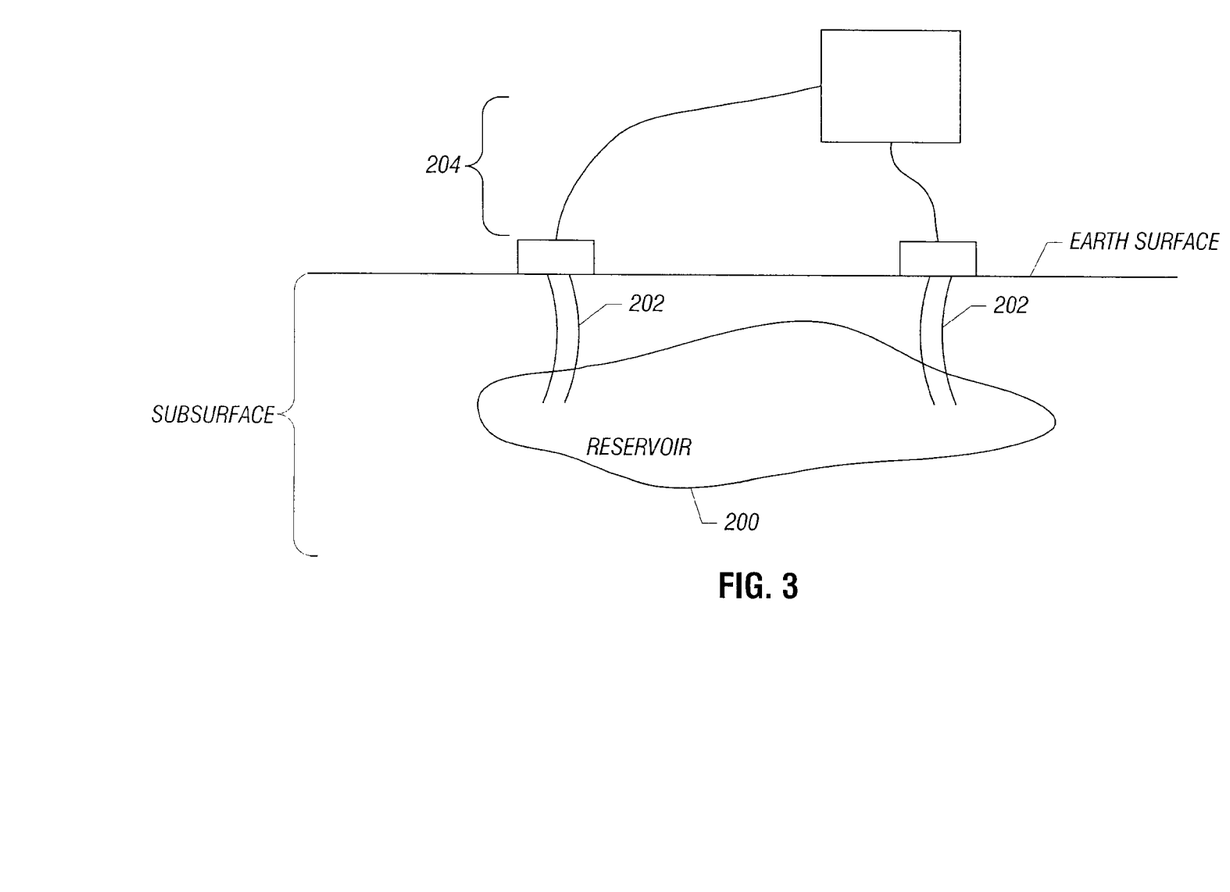
FIG. 3 is a schematic diagram of an exemplary arrangement that includes a subsurface having a reservoir that can be simulated using techniques according to some embodiments.

A reservoir that can be modeled and simulated in accordance with some embodiments is illustrated in FIG. 3, which shows a subsurface (subterranean formation) that includes a reservoir 200 from which fluids (e.g., hydrocarbons, fresh water, and so forth) can be produced. Wellbores 202 are drilled into the subsurface to intersect the reservoir 200. Although not shown, completion equipment can be provided in the wellbores 202 to assist in producing fluids from the reservoir 200 to the earth surface. Surface equipment 204 is deployed to allow for extraction of the fluids and to carry the extracted fluids to target locations. The arrangement of FIG. 3 can be a land-based arrangement or a marine arrangement (in which the reservoir 200 is located underneath a sea floor or other water bottom surface).

Figure 4:
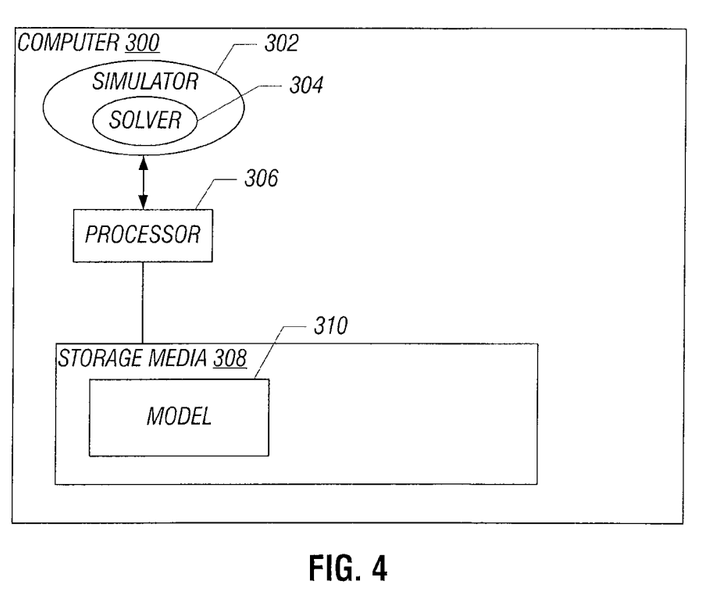
FIG. 4 is a block diagram of a computer that incorporates a simulator according to an embodiment.

The streamline simulation of a subterranean structure such as the reservoir 200 shown in FIG. 3 can be performed by a simulator 302 shown in FIG. 4. The simulator 302 can be implemented with software that is executable on a processor 306. The simulator 302 includes a multiscale mimetic pressure solver 304 according to some embodiments. The solver 304 is able to access a model 310 of the subterranean structure to be simulated, where the model 310 is stored in storage media 308 (which can be implemented with one or more disk-based storage devices and/or one or more integrated circuit or semiconductor storage devices). As discussed above, the model 310 provides explicit modeling of fracture corridors in the subterranean structure to be simulated. In some more specific embodiments, the model 310 is a multiscale grid model having at least a coarse grid and a fine grid as discussed above, where mimetic discretization has been applied to the fine grid. Alternatively, two-point finite volume discretization can be applied to the model 310.

In a different embodiment, the simulator 302 and solver 304 can be implemented with hardware, firmware, various logic, or any combination of software, hardware, firmware, and various logic.

The following describes mimetic discretization in greater detail. Streamline simulations are based on a sequential solution of equations written using a fractional flow formulation in which the pressure equation reads as follows:

$$c_t \frac{\partial p}{\partial t} + \nabla \cdot \vec{u} - \zeta \vec{u} \cdot (\lambda K)^{-1} \vec{u} = q, \text{ and } \vec{u} = -K\lambda \nabla p. \quad \text{(Eq. 1)}$$

Here the phase mobility is $\lambda_r = k_r/\mu_r$, the total mobility $\lambda = \Sigma \lambda_r$ and all other saturation-dependent parameters are evaluated using saturations from the previous time step n−1; K is the absolute permeability; $\zeta$ is shorthand for $\Sigma c_r f_r$, where $f_r = \lambda_r/\lambda$ is the fractional flow; q is the total source; and $c_r$ and $c_f$ are the phase and total compressibilities, respectively. Introducing a backward discretization in time, linearizing Eq. 1, and introducing an iteration parameter $v$, the pressure equation Eq. 1 can be written in the semi-discrete form:

$$c_t \frac{p_v^n - p^{n-1}}{\Delta t} + \nabla \cdot \vec{u}_v^n - \zeta_{v-1}^n \vec{u}_{v-1}^n \cdot (\lambda_{v-1}^n K)^{-1} \vec{u}_v^n = q, \quad \text{(Eq. 2)}$$

and $\vec{u}_v^n = -K\lambda_{v-1}^n \nabla p_v^n$.

The computational domain $\Omega$, which represents a block 152 in the coarse grid shown in FIG. 2, for example, is assumed to be discretized by a set of polyhedral cells. For a given cell E, let $u_E$ be the vector of outward fluxes over the $n_E$ faces of E, $p_E$ the pressure at the cell center, and $\pi_E$ the pressures at the cell faces. Similarly, let $N_E$ be the matrix containing the normal vector of the cell faces multiplied by the corresponding face area and $X_E$ be the matrix containing the vectors from the face centroids to the cell centroid. Introducing a transmissibility matrix $T_E$, the fluxes and the two pressures can be related as follows:

$$u_E = \lambda T_E (p_E - \pi_E). \quad \text{(Eq. 3)}$$

For the mimetic method, $T_E$ is generally a full matrix that can be constructed by imposing exactness for linear pressures. Hence, $T_E$ can be written in the form $T = |E|^{-1} N_E K_b N_E^T + \tilde{T}_E$, where the symmetric positive-definite matrix $\tilde{T}_E$ can be chosen arbitrarily as long as it satisfies $\tilde{T}_E X_E = 0$. This provides a certain freedom in the discretization, and the mimetic technique can be constructed such that the mimetic technique can coincide, for example, with either the two-point flux approximation (TFPA) technique or the mixed finite-element technique with lowest-order Raviart-Thomas basis functions on a Cartesian grid.

To finish the discretization of Eq. 2, let u denote the outward fluxes over the faces ordered cell-wise (in which interior faces appear twice with opposite signs), s the cell-wise saturations, p the cell pressures, and $\pi$ the face pressure. The following hybrid system is then obtained:

$$\begin{bmatrix} B & C & D \\ C^T - V_{v-1}^T & P & 0 \\ D^T & 0 & 0 \end{bmatrix} \begin{bmatrix} u_v \\ -p_v \\ \pi_v \end{bmatrix} = \begin{bmatrix} 0 \\ Pp^{n-1} + q \\ 0 \end{bmatrix}, \quad \text{(Eq. 4)}$$

which is solved until $\|p_{v-1} - p_v\|$ and $\|u_{v-1} - u_v\|$ are sufficiently small. The matrix P is diagonal with entry $(c_t |E|/\Delta t)$ for cell E. The matrix B is block diagonal with one block $(\lambda T)_E^{-1}$ for each cell E, and similarly, C contains blocks of $n_1 \times 1$ vectors with all entries equal one. If $D_\zeta$ and $D_u$ denote diagonal matrices with $\zeta^{n-1}$ and $u_{v-1}$ on the diagonal, respectively, then the block matrix $V_{v-1} = V(u_{v-1})$ is given by $BD_u CD_\zeta$. Finally, each column of D corresponds to a unique face and has one or two unit entries (for boundary and interior faces, respectively) corresponding to the index/indices of the face in the cell-wise ordering.

The following describes the multiscale mimetic pressure solver 304 in greater detail.

The multiscale mimetic pressure solver 304 according to some embodiments is a variant of a multiscale mixed finite-element solver, such as that described in Zhiming Chen et al., "A Mixed Multiscale Finite Element Method for Elliptic Problems with Oscillating Coefficients," (2003). The multiscale mimetic pressure solver 304 according to some embodiments has replaced inner-products of the multiscale mixed finite-element solver by mimetic approximation as discussed above. The solver 304 also represents multiscale basis functions in terms of a vector of fluxes on the fine grid inside each coarse block. The solver 304 can be applied to models for either compressible or non-compressible fluids. One example of compressible fluid is compressible, three-phase black oil.

As explained above, the multiscale solver is based on a hierarchical two-level grid in which the blocks $\Omega_i$ (e.g., 152 in FIG. 2) in the coarse grid includes a connected set of cells from the underlying fine grid, on which the full heterogeneity is represented. In its simplest form, the approximation space includes a constant approximation of the pressure inside each coarse block and a set of velocity basis functions associated with each interface between two coarse blocks. Consider two neighboring blocks $\Omega_i$ and $\Omega_j$, and let $\Omega_{ij}$ be a neighborhood containing $\Omega_i$ and $\Omega_j$. The basis function $\psi_{ij}$ is constructed by solving $$\vec{\psi}_{ij} = -\lambda K \nabla p_{ij}. \quad \text{(Eq. 5)}$$

$$\nabla \cdot \vec{\psi}_{ij} = \begin{cases} w_i(x), & \text{if } x \in \Omega_i, \\ -w_j(x), & \text{if } x \in \Omega_j, \\ 0, & \text{otherwise,} \end{cases}$$

in $\Omega_{ij}$ with $\vec{\psi}_{ij} \cdot \vec{n} = 0$ on $\partial \Omega_{ij}$. If $\Omega_{ij} \neq \Omega_i \cup \Omega_j$, then that basis function is computed using overlap or oversampling. The purpose of the weighting function $w_i(x)$ is to distribute $\nabla \cdot \vec{u}$ over the block and produce a flow with unit average velocity over the interface $\partial \Omega_i \cap \partial \Omega_j$, and the function is therefore normalized such that its integral over $\Omega_i$ equals one.

Let $\vec{\psi}_{ij}$ denote the basis function constructed by solving Eq. 5 using the mimetic discretization discussed above. To construct the coarse-scale system, the basis functions are written as $\vec{\psi}_{ij} = \vec{\psi}_{ij}^H - \vec{\psi}_{ji}^H$, where $\vec{\psi}_{ij}^H(E)$ is equal to $\vec{\psi}_{ij}(E)$ if $E \in \Omega_{ij} \setminus \Omega_j$ and zero otherwise, and $\vec{\psi}_{ij}^H(E)$ is equal to −

$\vec{\psi}_{ij}(E)$ if $E \in \Omega_j$ and zero otherwise. These hybrid basis functions are now collected as columns in a matrix $\Omega$.

Two prolongation operators I and J are introduced from blocks/coarse interfaces to cells/fine faces such that element ij equals one if block/coarse interface number j contains cell/face number i and zero otherwise. Then the global coarse-scale system reads, $$\begin{bmatrix} \Psi^T B_f \Psi & \Psi^T C_f I & \Psi^T D_f J \\ I^T (C_f - V_f)^T \Psi & I^T P_f I & 0 \\ J^T D_f^T \Psi & 0 & 0 \end{bmatrix} \begin{bmatrix} u \\ -p \\ \pi \end{bmatrix} = \begin{bmatrix} 0 \\ I^T P_f p_f^{n-1} \\ 0 \end{bmatrix}, \quad \text{(Eq. 6)}$$

where the subscript f indicates matrices from the fine-scale discretization. Once Eq. 6 is solved, the fine-scale fluxes can be obtained immediately as $u_f = \psi u$.

The following describes application of the multiscale mimetic pressure solver 304 to streamline simulation, in accordance with some embodiments.

The multiscale mimetic pressure solver 304 has two features that can be used to improve the performance of streamline simulation when dealing with geological models for which the fracture systems or fracture corridors are explicitly modeled.

The first feature (multiscale feature) allows for efficient computation of pressures, and the second feature (mimetic approach) allows for efficient handling of distorted or non-orthogonal grids and computation of the flux field. Distorted grids refer to grids having cells that are essentially non-uniform and non-orthogonal. Non-orthogonality in terms of the alignment of pressure drop and flow vectors can also arise due to anisotropy in permeability and also the non-alignment of permeability tensor with the grid cell orientation. Current methods for correcting non-orthogonality require significant computing resources. Alternatively, much effort is required to design appropriate simulation grids to represent flow accurately in complex geological models. In constructing a geological model, distorted grids are often used to correctly represent the geometry and volume of geologic features. Accurate flow simulation on distorted grids reduces the need to rebuild a grid for simulation purposes, further enhancing the speed of iterative modeling workflows. The mimetic approach is a multipoint flux-approximation technique that is robust but can lead to larger number of unknowns. Hence a multiscale technique is preferred as a companion to the mimetic approach to maintain performance.

There are generally two ways that the multiscale technique can be applied within a streamline simulator:

(1) as a fast, approximate pressure solver that reduces the number of independent unknowns in the pressure equation; or (2) as a technique that takes into account the impact of subcell heterogeneities that are not represented in the input grid.

The first technique is the classical multiscale modeling technique in which the primary input to the reservoir simulator is the fine-scale geologic grid and associated properties. All geologic features including fractures are modeled directly on the fine grid. The coarse grid, on which the solver seeks to solve for pressure, can be constructed either automatically (e.g., by partitioning a logically Cartesian grid into rectangular blocks in index space), or with varying degrees of user control.

The preliminary work can be done at the solver setup stage (by computing local solutions during the initial phase). In this way, the number of independent unknowns in the pressure equation is reduced, so that they become associated with the coarse grid. The velocity field realized on the fine grid is a good approximation to the direct fine-grid solution. The objective is to solve the pressure equation more efficiently on a smaller linear system while allowing for some deterioration in accuracy.

Computing the local solutions has an additional cost and recomputing the local solutions may be needed for multiphase flow. This, however, is where advances in computer systems can be exploited to maintain high performance. Every local problem is independent and can therefore be solved independently on different processing elements of a multiprocessing computer system.

In addition, streamline generation and solving saturation equations along streamlines are naturally parallel tasks that can be executed in parallel in a multiprocessing computer system. This can be particularly useful in fractured reservoir simulation, as considerable time can be taken by a one-dimensional finite-difference saturation solver in solving for saturation along each streamline.

The second technique discussed above applies the multiscale technique to two separate grid systems. The primary grid includes the background geological information on which a secondary grid or grid system representing high-impact features like fractures is superimposed. The secondary grid is expected to have a resolution commensurate to the characteristics of the geologic features.

The primary grid can be used as a preliminary candidate for the coarse grid for the multiscale approach. The union of the primary and secondary grid is constructed afterwards and automatically (if possible). The primary grid serves only as a preliminary candidate and may require modification to better model the discrete geologic objects. For example, it might be irrelevant to have higher grid resolution in areas away from fracture corridors. Therefore, one can find the cells containing fracture corridors and only refine them and possibly their neighbors. This way, one may combine the primary grid with locally refined structured or unstructured grids.

The mimetic discretization described above is well suited for both structured and unstructured grids containing polyhedral cells. The local solutions are used in assembling the matrices needed in solving the pressure equation, for constructing the detailed velocity field and tracing streamline inside the (coarse) cell. It is not necessary to store the whole fine grid explicitly; one only needs to obtain the relation between the cells in the primary grid, their refinement, and the composition of the coarse grid (which could be different from the primary grid). The cells having no refinement need no local solution and no additional memory storage. These cells can be treated in the same way as they are treated in the mimetic technique to minimize the storage and the work needed to assemble the matrices.

The multiscale approach has the ability to reconstruct a fine-scale velocity while taking into account the high flow rate in narrow fracture corridors, so that the streamlines constructed from the fine-grid velocity are denser in the fracture corridors. Consequently, the multiscale-streamline solution reproduces the small-scale features of the fine-grid solution.

Figure 5:
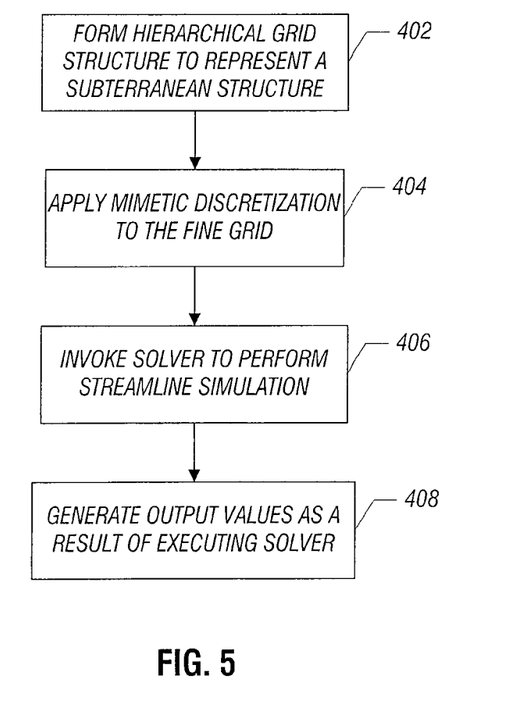
FIG. 5 is a flow diagram of a process of performing streamline simulation using a multiscale mimetic solver, according to an embodiment.

FIG. 5 is a flow diagram of a process of performing streamline simulation using a multiscale mimetic solver according to an embodiment. The process of FIG. 5 can be performed by software, hardware, firmware, various logic, and so forth (or any combination thereof). Initially, a hierarchical grid structure including at least a coarse grid and a fine grid is formed (at 402). The coarse grid is partitioned from an input grid (e.g., Cartesian grid) into blocks, where each block has a collection of connected cells that are associated with various reservoir properties, such as rock and rock-fluid properties.

Next, mimetic discretization is applied (at 404) to the fine grid to improve efficiency when solving a pressure equation to solve for pressure and flux values. The multiscale mimetic solver 304 is then invoked (at 406) to perform streamline simulation. As a result of the execution of the solver 304, output values (e.g., pressure and flux values) are generated (at 408) for output.

Instructions of software described above (including the simulator 302 and solver 304 of FIG. 4) are loaded for execution on a processor (such as processor 306 in FIG. 4). The processor includes microprocessors, microcontrollers, processor modules or subsystems (including one or more microprocessors or microcontrollers), or other control or computing devices. A "processor" can refer to a single component or to plural components (e.g., one CPU or multiple CPUs in one or multiple computers).

Data and instructions (of the software) are stored in respective storage devices, which are implemented as one or more computer-readable or computer-usable storage media. The storage media include different forms of memory including semiconductor memory devices such as dynamic or static random access memories (DRAMs or SRAMs), erasable and programmable read-only memories (EPROMs), electrically erasable and programmable read-only memories (EE-PROMs) and flash memories; magnetic disks such as fixed, floppy and removable disks; other magnetic media including tape; and optical media such as compact disks (CDs) or digital video disks (DVDs).

While some embodiments have been disclosed, those skilled in the art, having the benefit of this disclosure, will appreciate numerous modifications and variations therefrom. It is intended that the appended claims cover such modifications and variations.

What is claimed is:

1. A method of simulating compressible multi-phase fluid flow to characterize a subterranean structure containing a fracture corridor, comprising:
   representing the subterranean structure using a model,
      wherein the model includes a first grid and a second, finer grid that resolves the fracture corridor to define a connected collection of cells and wherein about the connected collection of cells, cells of the first grid are mathematically coupled to cells of the second grid; and
   performing, by a processor, a streamline simulation using the model wherein a multiscale pressure solver solves for pressure and fluxes using multipoint flux approximations for cell interface fluxes of a flux field for tracing streamlines that characterize the subterranean structure and the fracture corridor and wherein the multiscale pressure solver accounts for mobility and compressibility of the compressible multi-phase fluid.

2. The method of claim 1, wherein performing the streamline simulation using the model comprises performing the streamline simulation using the model to which one of (a) two-point finite volume discretization and (b) mimetic discretization has been applied as flux approximations for cell interface fluxes.

3. The method of claim 1, further comprising: during an initial phase, computing local solutions to solve for output values in local regions of the subterranean structure to reduce a number of unknowns when solving a pressure equation by the solver.

4. The method of claim 3, wherein computing the local solutions comprises computing the local solutions in parallel using corresponding processing elements of a multiprocessing computer system.

5. The method of claim 1, wherein the fracture corridor of the second grid is to be superimposed on the first grid.

6. The method of claim 5, wherein the first grid contains dual porosity information to model minor fractures not modeled by the second grid.

7. A computer comprising:
   a storage media to store a grid structure that models a subterranean structure, wherein the grid structure also represents a fracture corridor in the subterranean structure; and
   a processor to:
      represent the subterranean structure using the grid structure; and
      execute a streamline solver to perform streamline simulation for compressible multi-phase fluid flow to produce output values using the grid structure
         wherein the grid structure comprises a first grid and a second, finer grid that represents the fracture corridor by resolving the fracture corridor to define a connected collection of cells,
         wherein, about the connected collection of cells, cells of the first grid are mathematically coupled to cells of the second grid, and
         wherein a multiscale pressure solver solves for pressure and fluxes using multipoint flux approximations for cell interface fluxes of a flux field for tracing streamlines that characterize the subterranean structure and the fracture corridor, wherein the multiscale pressure solver accounts for mobility and compressibility of the compressible multi-phase fluid.

8. The computer of claim 7, wherein the subterranean structure comprises a fluid reservoir, and wherein the processor is configured to further:
   provide a reservoir model that does not include the fracture corridor;
   provide a representation of the fracture corridor; and
   combine the reservoir model and the representation to create the grid structure.

9. An article comprising at least one computer-readable non-transitory storage medium containing instructions that upon execution cause a processor to:
   provide a model of a reservoir, wherein the model contains a representation of a fracture corridor in the reservoir; and
   perform streamline simulation for compressible multi-phase fluid flow using the model that contains the representation of the fracture corridor
      wherein the model comprises a first grid that includes geological information of the reservoir and a second, finer grid for the representation of the fracture corridor by resolution of the fracture corridor to define a connected collection of cells and wherein, about the connected collection of cells, cells of the first grid are mathematically coupled to cells of the second grid, and
      wherein a multiscale pressure solver solves for pressure and fluxes using multipoint flux approximations for cell interface fluxes of a flux field for tracing streamlines that characterize the reservoir and the fracture corridor, wherein the multiscale pressure solver accounts for mobility and compressibility of the compressible multi-phase fluid.

10. The article of claim 9, wherein the multipoint flux approximations for cell interface fluxes includes one of (a) a two-point finite volume discretization and (b) mimetic discretization.

11. The method of claim 1 wherein the first grid and the second grid comprise three-dimensional grids.

12. The method of claim 11 wherein the connected collection of cells comprises polyhedral cells.

13. The method of claim 1 comprising identifying a cell of the first grid that includes at least a portion of the fracture corridor and refining the identified cell to form at least a portion of the second, finer grid.

14. The method of claim 13 comprising refining a neighboring cell of the identified cell to form at least a portion of the second, finer grid.

15. The method of claim 13 comprising providing a local solution for the refined identified cell.

16. The method of claim 15 comprising using the local solution for assembling at least one matrix for solving for pressure, for constructing a least a portion of a velocity field and for tracing at least one of the streamlines.

17. The method of claim 1 wherein the connected collection of cells of the second grid, being finer than the first grid, provides for an increase in streamline density to account for flow rates in the fracture corridor.

18. The method of claim 1 wherein the subterranean structure contains multiple fracture corridors and wherein the model comprises a plurality of finer grids wherein each of the finer grids resolves at least one of the fracture corridors to define a respective connected collection of cells.

19. The computer of claim 7 wherein the grid structure represents multiple fracture corridors and wherein the grid structure comprises a plurality of finer grids wherein each of the finer grids resolves at least one of the fracture corridors to define a respective connected collection of cells.

20. The article of claim 9 wherein the model contains a representation of multiple fracture corridors in the reservoir and wherein the model comprises a plurality of finer grids wherein each of the finer grids resolves at least one of the fracture corridors to define a respective connected collection of cells.

* * * * *